(12) United States Patent
Walter (10) Patent No.: US 10,535,584 B2
(45) Date of Patent: Jan. 14, 2020

(54) POWER ELECTRONIC ARRANGEMENT AND ELECTRIC VEHICLE WITH SUCH AN ARRANGEMENT

(71) Applicant: SEMIKRON ELEKTRONIK GMBH & CO. KG, Nuremberg (DE)

(72) Inventor: Christian Walter, Ansbach (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 15/957,982

(22) Filed: Apr. 20, 2018

(65) Prior Publication Data

US 2018/0337108 A1 Nov. 22, 2018

(30) Foreign Application Priority Data

May 17, 2017 (DE) .................. 10 2017 110 722

(51) Int. Cl.
*H01L 23/40* (2006.01)
*H01L 23/055* (2006.01)
(Continued)

(52) U.S. Cl.
CPC ........ *H01L 23/4006* (2013.01); *H01L 23/055* (2013.01); *H05K 7/209* (2013.01);
(Continued)

(58) Field of Classification Search
CPC ... H01L 23/4006; H01L 23/055; H01L 24/48; H01L 2023/4031; H01L 2023/4062; H01L 2023/4087; H01L 2224/48101; H01L 2224/48106; H01L 2224/4813; H01L 2224/48227; H01L 2924/14252; H01L 23/3735; H01L 23/36; H01L 23/48; H01L 25/07; H05K 7/20409; H05K 7/20854;
(Continued)

(56) References Cited

U.S. PATENT DOCUMENTS 5,969,286 A 10/1999 Ward et al.
6,122,170 A * 9/2000 Hirose .................. C04B 37/026
174/16.3

(Continued)

FOREIGN PATENT DOCUMENTS

DE  10 2016 107 083   11/1917

OTHER PUBLICATIONS

DE 10 2017 110 722.3 Examination Report dated Jan. 12, 2018, 2 pages—English, 5 pages—German.

*Primary Examiner* — Jayprakash N Gandhi
*Assistant Examiner* — Stephen S Sul
(74) *Attorney, Agent, or Firm* — Lackenbach Siegel, LLP; Andrew F. Young (57) ABSTRACT

A power electronic arrangement having a power semiconductor module and an external load-connecting element is provided with the external load-connecting element has a first connection device, and the power semiconductor module has a housing, a base plate and an internal load-connecting element with a second connection device, wherein the base plate has a first cut out through which the first connection device extends into the interior of the power semiconductor module and is connected there in a frictionally locking and electrically conductive fashion to a second connection device of the internal load-connecting element.

11 Claims, 4 Drawing Sheets

(51) Int. Cl.
*H05K 7/20* (2006.01)
*H01L 23/373* (2006.01)
*H01L 23/00* (2006.01)
*H01R 4/34* (2006.01)
*H01R 4/56* (2006.01)

(52) U.S. Cl.
CPC ..... *H05K 7/20409* (2013.01); *H05K 7/20854* (2013.01); *H01L 23/3735* (2013.01); *H01L 24/48* (2013.01); *H01L 2023/4031* (2013.01); *H01L 2023/4062* (2013.01); *H01L 2023/4087* (2013.01); *H01L 2224/4813* (2013.01); *H01L 2224/48101* (2013.01); *H01L 2224/48106* (2013.01); *H01L 2224/48227* (2013.01); *H01L 2924/14252* (2013.01); *H01R 4/34* (2013.01); *H01R 4/56* (2013.01)

(58) Field of Classification Search
CPC . H05K 7/209; H01R 4/34; H01R 4/56; B60R 16/03
USPC .............. 361/679.02, 679.54, 704, 714, 820
See application file for complete search history.

(56) References Cited

U.S. PATENT DOCUMENTS

| | | |
|---|---|---|
| 6,591,754 B1 | 7/2003 | Baur et al. |
| 2001/0012212 A1* | 8/2001 | Ikeda .................. H02M 7/003 363/141 |
| 2003/0151128 A1* | 8/2003 | Kawaguchi ........... H01L 25/072 257/691 |
| 2004/0145048 A1* | 7/2004 | Frisch ................. H01L 23/3672 257/712 |
| 2008/0277780 A1* | 11/2008 | Hayakawa ......... H05K 7/20509 257/717 |
| 2009/0261472 A1* | 10/2009 | Bayerer .................. H01L 24/06 257/719 |
| 2010/0127371 A1* | 5/2010 | Tschirbs ................. H01L 23/13 257/684 |
| 2010/0165582 A1* | 7/2010 | Hornkamp ........... H01L 23/053 361/740 |
| 2011/0266686 A1* | 11/2011 | Yamaguchi ......... H01L 23/3107 257/773 |
| 2012/0057318 A1* | 3/2012 | Oota ..................... H05K 5/006 361/753 |
| 2012/0218716 A1* | 8/2012 | Asakura ............. H01L 23/4006 361/717 |
| 2012/0256194 A1* | 10/2012 | Yoshihara ......... H01L 23/49822 257/77 |
| 2013/0088128 A1* | 4/2013 | Nakano ................ B62D 5/0406 310/68 R |
| 2013/0314876 A1* | 11/2013 | Martin ................. H05K 7/1432 361/714 |
| 2014/0376184 A1* | 12/2014 | Gohara ................. H01L 23/473 361/689 |
| 2014/0376188 A1* | 12/2014 | Morino .................. H05K 7/209 361/709 |
| 2015/0216089 A1* | 7/2015 | Tanaka .................. H05K 7/209 361/699 |
| 2015/0325494 A1* | 11/2015 | Kroneder ........... H01L 23/4006 361/715 |

* cited by examiner

POWER ELECTRONIC ARRANGEMENT AND ELECTRIC VEHICLE WITH SUCH AN ARRANGEMENT

CROSS REFERENCE TO RELATED APPLICATION

This application relates to, and claims priority from, Ser. No.: DE 10 2017 110 722.3 filed May 17, 2017, the entire contents of which are incorporated herein by reference.

FIGURE SELECTED FOR PUBLICATION

FIG. 4

BACKGROUND OF THE INVENTION

Field of the Invention

The present invention describes a power electronic arrangement having a power semiconductor module and having a mounting device, as well as an electric vehicle with said arrangement, wherein the vehicle can be a purely electrically powered industrial truck, but also a purely electrically powered passenger car, a passenger car which is powered by hybrid drive with an electrical component, but also a likewise powered transportation vehicle for transportation within the premises of a company or transportation on public roads.

Description of the Related Art

A power electronic arrangement, embodied with a power semiconductor module, with a contact spring, with a load-connecting element and with a mounting device, which is embodied as part of an electrically operated vehicle, is known from the prior art, disclosed, for example, in DE 10 2016 107 083 A1, the entire contents of which are incorporated by reference but which was not published before the priority date of the present document, wherein the power semiconductor module has a load-connection element which preferably protrudes outwards from the interior of the power semiconductor module and preferably has there a first external contact face, that is to say a contact face for external connection, and wherein the load-connecting element has a second contact face. An electrically conductive pressure contact connection between the first contact face and the second contact face is embodied by means of the contact spring, wherein the pressure which is necessary for this is applied to the contact spring by virtue of the fact that the power semiconductor module is connected in a frictionally locking fashion to the mounting device.

ASPECTS AND SUMMARY OF THE INVENTION

The present invention is based on the adaptive and alternative object of presenting a power semiconductor module within the scope of a power electronic arrangement and a vehicle, wherein the integration of the power semi-conductor module into the vehicle is configured in an effective and flexible fashion.

This object is achieved according to the invention by means of a power electronic arrangement having the features noted herein and as further identified in the claims. The present invention is not limited to the preferred refinements described in the respective language below.

The power electronic arrangement according to the invention is embodied with a power semiconductor module and with an external load-connecting element, wherein the external load-connecting element has a first connection device, and wherein the power semiconductor module has a housing, a base plate and an internal load-connecting element with a second connection device, wherein the base plate has a first cut out through which the first connection device extends into the interior of the power semiconductor module and is connected there in a frictionally locking and electrically conductive fashion to a second connection device of the internal load-connecting element.

It is particularly preferred if the metallic base plate is embodied as a metal body, preferably as a cooling device, and in this context either as a water cooling device or air cooling device.

It is likewise advantageous if an insulating material body, which electrically insulates the base plate with respect to the first connection device, is arranged in the first cut out in the base plate. This insulating material body can be embodied in one piece and can electrically insulate a multiplicity of connection devices from one another and with respect to the base plate.

The external load-connecting element is advantageously embodied as a connection cable with a first connection device which is arranged in a materially bonded, frictionally locking or positively locking fashion. In particular it is advantageous if the first connection device is embodied as a metallic extruded part and the latter has a first connection means for connecting in a frictionally locking manner to a second connection means.

It can, however, also be preferred if the external load-connecting element is embodied as a connection pin with a first connection means for a frictionally locking connection to a second connection means.

An optional arrangement aspect noted herein, is a mount wherein the first connection means and the second connection means come together to form a bayonet connection and alternatively or additionally the first connection means can be embodied as a thread or as a blind hole with an internal thread, and the second connection means can be embodied as a screw nut or as a screw arranged with its thread in the thread of the blind hole.

It may frequently be advantageous if the housing has a second cut out which is designed for feeding through a tool, in order to connect the first connection device in an electrically conductive fashion to the second connection device by means of the assigned first and second connection means.

The electrically powered vehicle according to the invention is embodied in a way which is relevant for the invention, with a power electronic arrangement described above, with an energy storage device and with an electric drive motor as a main drive or auxiliary drive.

It is particularly advantageous if some of the external load-connecting elements are embodied as connection pins which are an integral component of a mounting device, and wherein these external load-connecting elements are arranged electrically insulated from a mounting device. Other external load-connecting elements can be embodied as connection cables.

It is likewise advantageous if the mounting device is embodied as an axle drive device.

Of course, unless excluded per se, the features which are mentioned in the singular, in particular the load-connecting elements with assigned connection devices, can be present in the plural in the respective arrangement or in the vehicle. A plurality of power electronic arrangements can also be present in a vehicle.

Of course, the various refinements of the invention can be implemented individually or in any desired combination, in order to achieve improvements. In particular, the features which are mentioned and explained above and below can be used not only in the specified combinations but also in other combinations, or alone, without departing from the scope of the present invention, irrespective of whether they are mentioned within the scope of the arrangement or of the vehicle.

The above and other aspects, objects, features and advantages of the present invention will become apparent from the following description read in conjunction with the accompanying drawings, in which like reference numerals designate the same elements.

DETAILED DESCRIPTION OF THE PREFERRED EMBODIMENTS

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "an embodiment", "variants," and "one/the embodiment/variant," or "one version," "a version" and the like, should be understood to mean that a particular feature, structure, or characteristic described in connection with the variant or version is included in at least one such embodiment or variant or version according to the disclosure. Thus, the appearances of elements in one embodiment, version, or variant will be understood to be adaptively applicable to other embodiments, versions, or variants and that one embodiment does not necessarily refer to the same embodiment, version or variant. Nor are separate or alternative versions or variants mutually exclusive of other versions or variants. Moreover, various features may be described which possibly may be exhibited by some variants or versions and not by others.

Various operations may be described as multiple discrete operations in turn, in a manner that may be helpful in understanding embodiments of the present invention; however, the order of description should not be construed to imply that these operations are order dependent.

Figure 1:
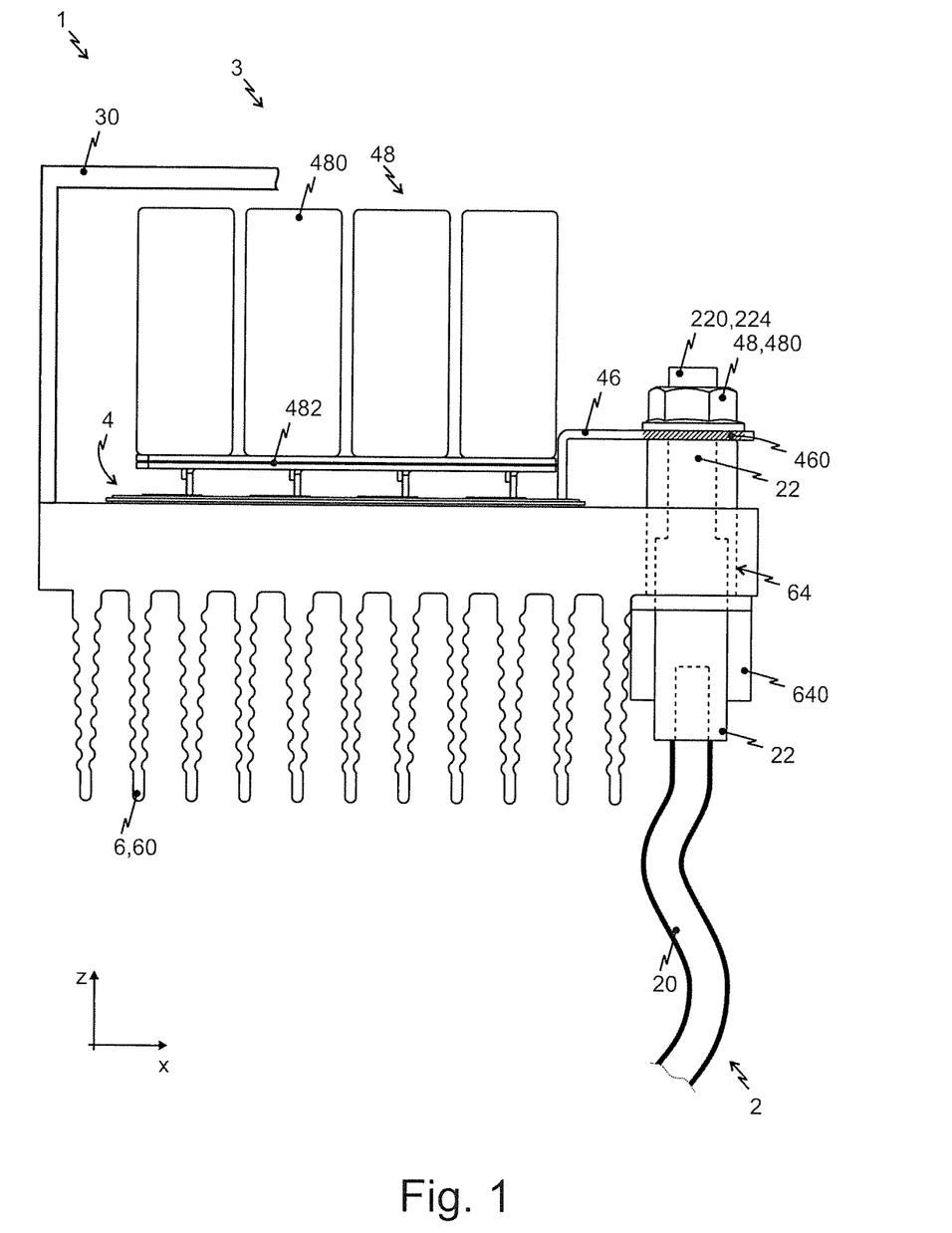
FIG. 1 is a schematic view of a first alternative embodiment of a power electronic arrangement according to the invention.

FIG. 1 shows a schematic view of a first embodiment or refinement of a power electronic arrangement 1 according to the invention. The latter has a power semiconductor module 3 which is composed, for its part, of a housing 30, a circuit carrier 4 and a metallic base plate 6, embodied here as an air cooling device 60. The circuit carrier 4 is arranged here on the air cooling device 60 by means of a heat-conducting layer, and is covered or enclosed with respect to the air cooling device 60 by the housing 30 which is beaker-shaped here. Furthermore, a capacitor device 48 is arranged in this housing 30 and is connected to the circuit carrier 4 appropriately in terms of this circuitry. The capacitor device 48 is composed of a multiplicity of capacitors 480 and a capacitor-connecting device 482 which connects the latter. This capacitor-connecting device 482 has a multiplicity of contact feet with which the electrically conductive contact is formed between the capacitors 480 and the circuit carrier 4, to be precise with the conductor tracks arranged there.

Figure 4:
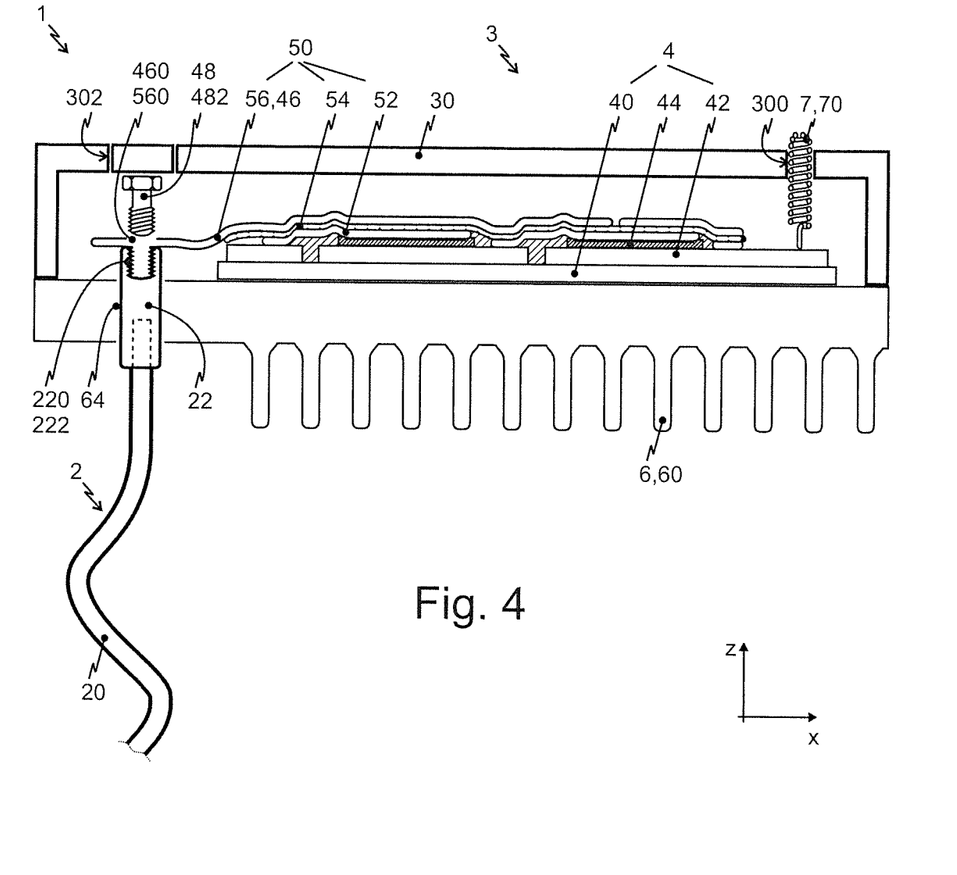
FIGS. 4 to 6 show further refinements of a power electronic arrangement according to the invention.
Figure 5:
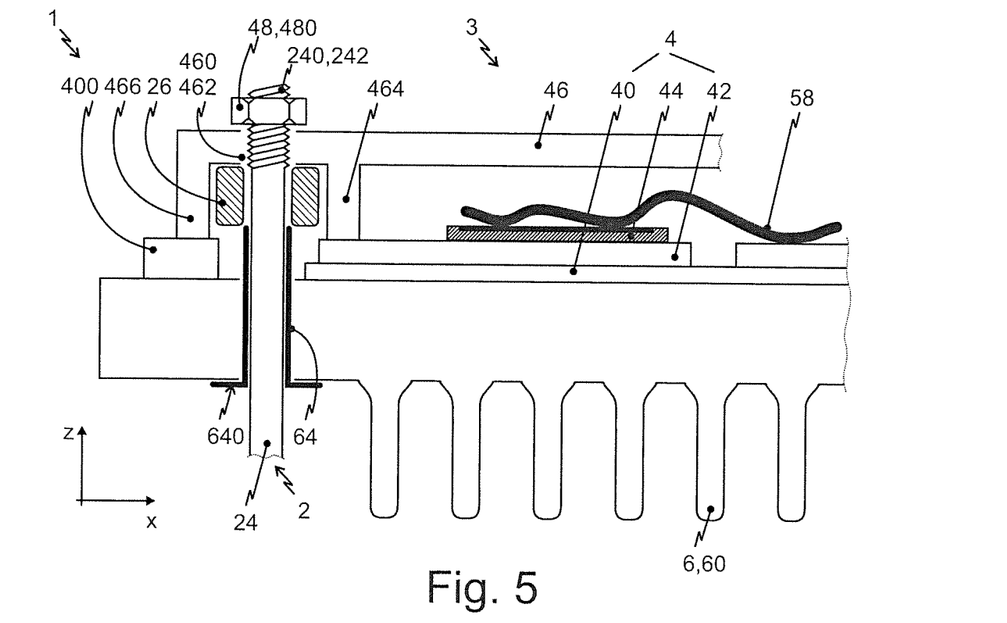
Figure 6:
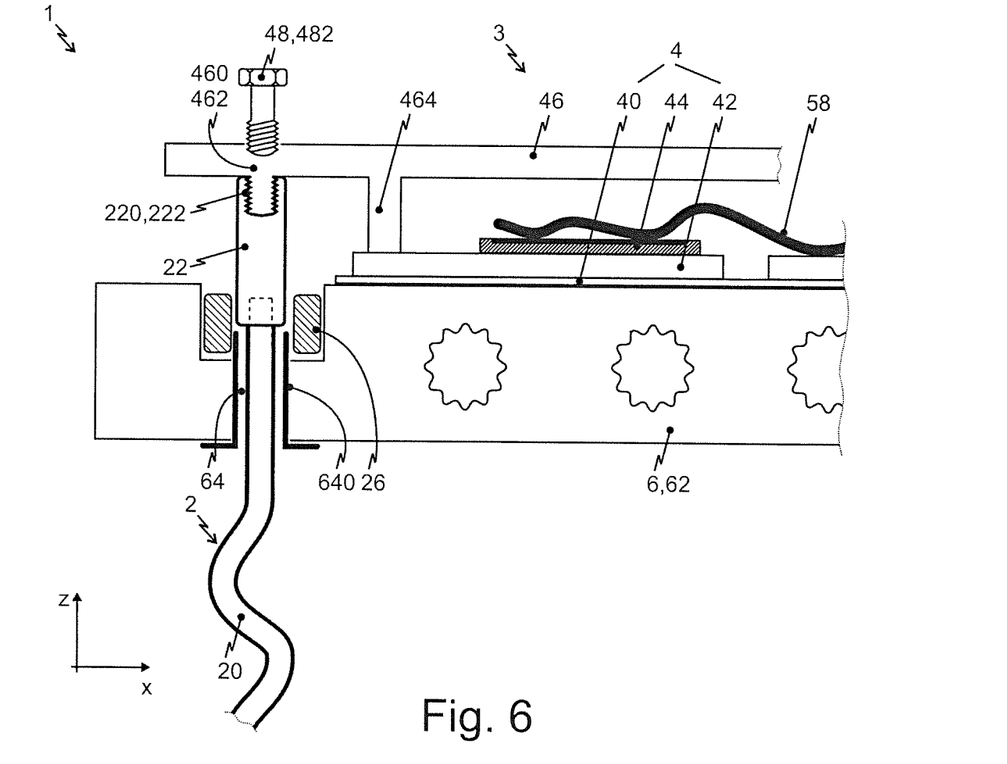

The circuit carrier 4 has in this refinement a conventional substrate 40, cf. FIGS. 4 to 6 with a preferably ceramic insulating body 40 which has a multiplicity of conductor tracks 42 on the side facing away from the air cooling device 60, and is fitted with a metallic lining on the side facing the air cooling device 60. The conductor tracks 42 are fitted with power semiconductor components 44 which are connected appropriately in terms of the circuitry in a conventional way which is however not illustrated. The power semiconductor module 3 which is illustrated here, in particular the switching device contained herein is designed to convert DC voltage into a three-phase AC voltage, that is to say forms a three-phase power inverter, as is customarily used to operate a three-phase electric motor, wherein the energy is extracted from a battery. This power semiconductor module 3 can basically also supply energy back into the battery in the generator mode of the connected three-phase electric motor. All the power electronic arrangements 1 presented here are basically embodied as described here.

Also illustrated is one of a plurality of internal load-connecting elements 46, which forms here the connection between the substrate 4, to be more precise a conductor track of the substrate 4, and an assigned external load-connecting element 2. This internal load-connecting element 46 is embodied as a metal shaped body which is connected in an electrically conductive fashion to the assigned conductor track of the substrate 4. Such load-connecting elements 46 serve customarily as the inline and outline for electrical energy from the switching device or the capacitor device 48 connected thereto.

Also illustrated is one of a plurality of external load-connecting elements 2, which is embodied here as a connection cable 20 with a first connection device 22, which is embodied as an extruded part, and is connected in a frictionally locking fashion to the end of the connection cable 20. Basically, the external load-connecting element 2 extends through a cut out 64 in the base plate 6 into the interior of the power semiconductor module 3. For the purpose of electrical insulation, an insulating material body 640 is arranged in the cut out 64 in the base plate 6 and prevents an electrically conductive connection between the first connection element 22 and the base body 6. The insulating material body 640 itself has in turn a cut out through which the external load connection element 2, to be more precise its first connection device 22, extends into the interior of the power semiconductor module 3.

The first connection device 22 has a first connection means 220, a threaded pin, which extends through an assigned second connection element 460 of the internal connecting element 46, which is embodied as a round cut out. By means of a second connection means 48, embodied here as a screw nut 480 which is screwed onto the threaded pin, the first connection element 22 is connected in a frictionally locking and electrically conductive fashion to the second connection element 460, as a result of which the internal load-connecting element 46 is also connected in an electrically conductive fashion to the external load-connecting element 2 in the interior of the power semiconductor module 3.

Figure 2:
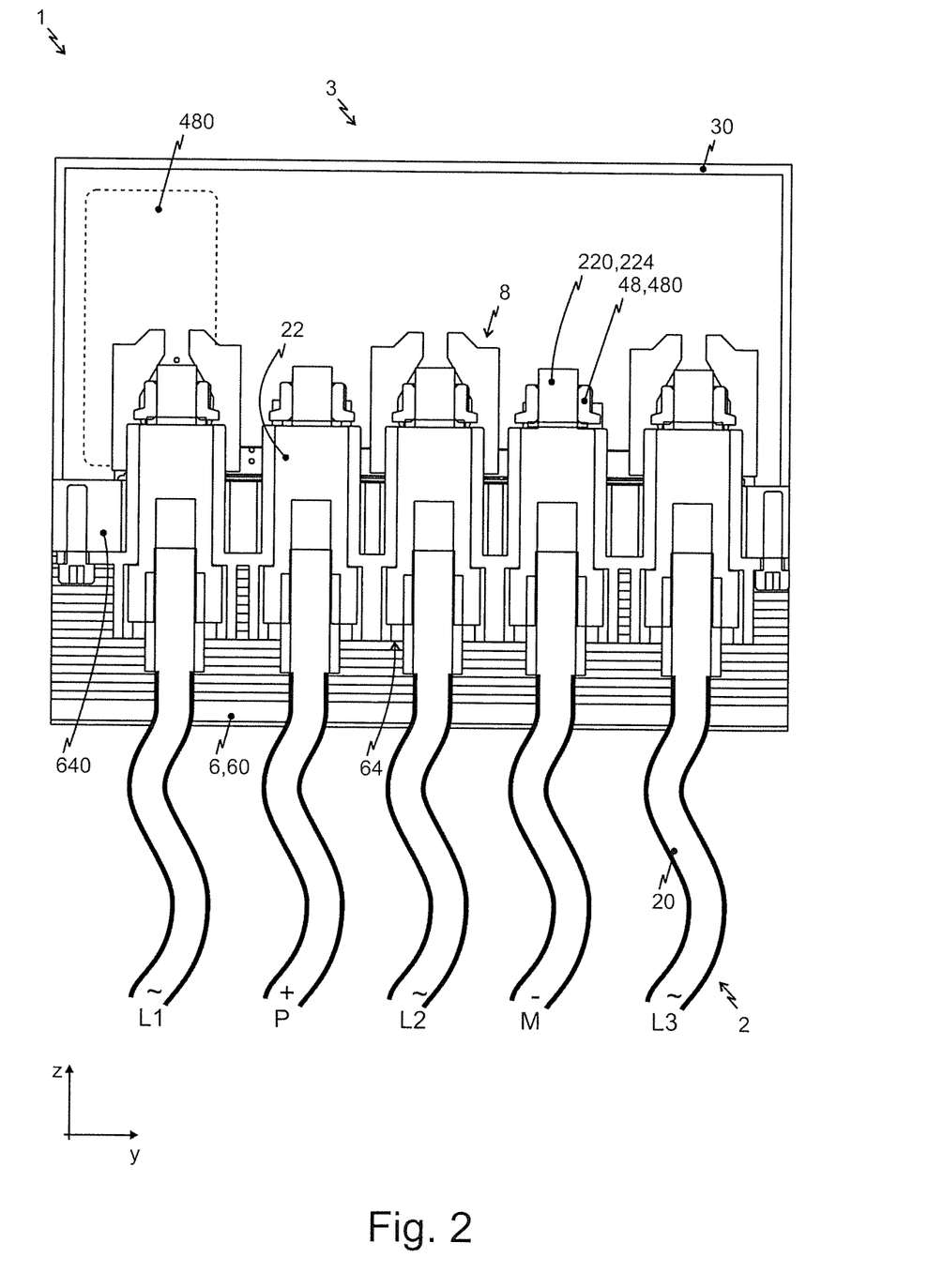
FIG. 2 is a schematic view of a second alternative embodiment of a power electronic arrangement according to the invention.

FIG. 2 shows a schematic view of a second alternative embodiment or refinement of a power electronic arrangement 1 according to the invention, which is basically similar to the first refinement, wherein a further explicit description of the same features is therefore not given. Five external load-connecting elements 2 are illustrated here, two of which serve for connection to a battery and therefore conduct DC voltage L and M, while the other three are provided for connecting to a three-phase electric motor. The three external load-connecting elements 2 which conduct AC voltage L1, L2 and L3 are each embodied as a connection cable 20, each with a first connection device 22, wherein this first connection device 22 is embodied as an extruded part and is connected in frictionally locking fashion to the end of the connection cable 20.

A first connection means of the first connection line is embodied as part of a bayonet connection 8, while a second connection means, that of the internal load-connecting element, is embodied as a second part of a bayonet connection 8. In addition, both are also connected by means of a screw connection 224, 480.

The two external load-connecting elements 2 which conduct DC voltage are basically embodied in an identical way, but they do not have a bayonet connection.

Figure 3:
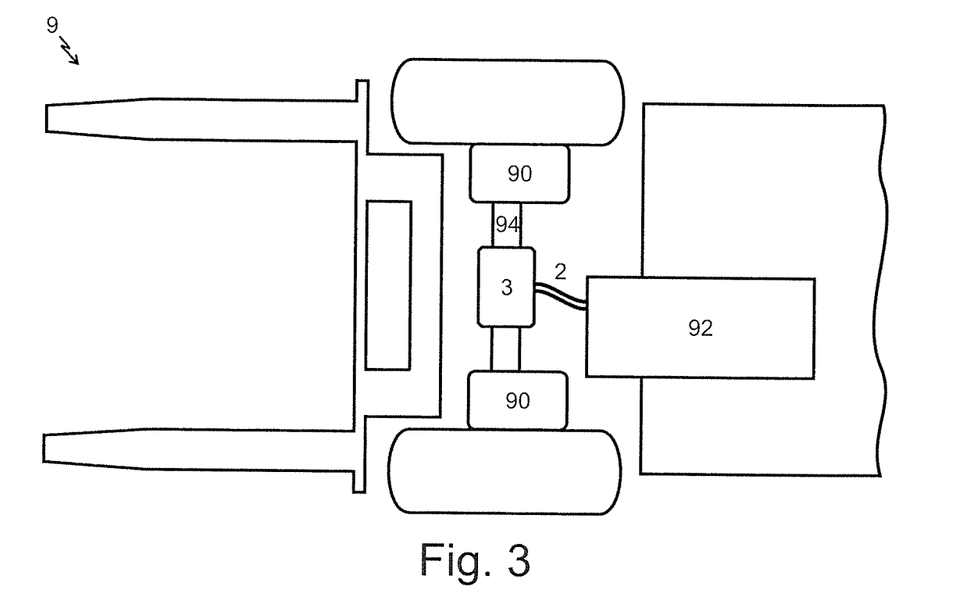
FIG. 3 is a schematic view of an electric vehicle according to the invention.

FIG. 3 shows a schematic view of an electrically powered vehicle 9 according to the invention, here specifically an industrial truck, for example a fork lift truck, in a partial view. Basically, other vehicles with electric power or hybrid-electric power, for example passenger cars, could also be embodied functionally in the same way. In particular, the front axle of the fork lift truck is illustrated, with one traction motor 90 per wheel. The front axle, more generally the wheel carrier or the wheel suspension, functions in this refinement as a mounting device 94, on which the power semiconductor module 3 is directly arranged. This power semiconductor module 3 is connected by means of a load-connecting element 7 to the traction motors 90 and to an energy storage device 92, that is to say to a battery, to be more precise a re-chargeable accumulator.

FIGS. 4 to 6 show further refinements of a power electronic arrangement 1 according to the invention. These each have a metallic base plate 6 in the form of a cooling device, which cooling devices are embodied in the embodiments according to FIGS. 4 and 5 as an air cooling device 60, and in the embodiment according to FIG. 6 as a liquid cooling device 62. On these cooling devices, substrates 4 of the switching device are each arranged with an electrically insulating body 40, embodied as a ceramic body or as an insulation film, with a multiplicity of conductor tracks 42 and basically conventional power semiconductor components 44 which are arranged hereon and connected appropriately in terms of the circuitry. Furthermore, all the embodiments have in common the fact that the respectively illustrated external load-connecting element 2 extends through a cut out 64 in the cooling device 6 into the interior of the power semiconductor module 3 and is connected there in an electrically conductive fashion to an internal load-connecting element 46.

In the refinement according to FIG. 4, the power electronic arrangement 3 has, as an internal connecting device for connecting the switching device appropriately in terms of circuitry, to be more precise the power semiconductor components 44 and the conductor tracks 42 of the substrate 4, a conventional film composite 50 made of alternately arranged electrically conductive films 52, 56 and electrically insulating films 54 which are inherently patterned and can also have vias (pathways) between different layers of electrically conductive films 52, 56. In this refinement, this film composite 50, to be more precise here one of the electrically conductive films 56 serves at the same time as an internal load-connecting element 46. For this purpose, the film composite 50, only the one electrically conductive film 56 illustrated here, projects over the edge of the substrate 2 and has a second connection device 460 in this section.

The single illustrated external load-connecting element 2 is embodied as a connection cable 20 with a first connection device 22, wherein this first connection device 22 is embodied as an extruded part and is connected in a frictionally locking fashion to the end of the connection cable. The first connection device 22 also has a blind hole 222 with internal thread.

The first connection device 22 projects through a cut out 64 in the cooling device 6 into the interior of the power semiconductor module 3 and has here an external insulation layer, arranged at least in the region of the cut out 64 itself, in order to be electrically insulated from the heat sink 6.

The blind hole 222 of the first connection device 22 forms the first connection means 220 of the external load-connecting element 2 and is arranged aligned with an assigned cut out in the second connection device 460 of the internal load-connecting element 46. A screw 482, illustrated here in an exploded illustration, extends into the blind hole 222 through the cut out in the second connection device 460 and therefore forms the electrically conductive connection between the first connection device 2 and the second connection device 46.

The housing 30 of the power semiconductor module 3 also has a first housing cut out 300 on the side facing away from the cooling device 6, through which housing cut out 300 a control connection element 7, illustrated schematically as a contact spring 70, extends. This control connection element 7 can, of course, also alternatively be embodied, for example, as a D-sub-socket or as an optical interface. In the latter, as in all the other refinements of the power semiconductor modules 3 which are mentioned by way of example a control circuit board (not illustrated) may be present which processes external control signals and which correspondingly actuates the power semiconductor components 44.

The housing 3 also has a second housing cut out 302 (illustrated here in a closed form) which is designed for feeding through a tool, in order to connect the first connection device 22 in an electrically conductive fashion to the second connection device 460 by means of the assigned first and second connection means 222, 482.

In the refinement according to FIG. 5, the power electronic arrangement 1 has customary wire bonding connections 58 as an internal connecting device for connecting the switching device appropriately in terms of circuitry.

The internal load-connecting element 46 is, similarly to the description below in FIG. 1, a metallic shaped body, for example made of thick copper plate. This shaped body 46 has here a contact foot 464 which has an electrically conductive contact with a conductor track 42. Furthermore, the shaped body 46 has a standing foot 466 with which it is supported against an insulator 400 which is arranged on the cooling device 6.

The external load-connecting element 2 is embodied here as a connection pin 24 which has a thread 242 at its end. The connection pin 24 extends through into the interior of the power semiconductor module 3 through an insulating material body 640 which is arranged in a cut out 64 of the cooling device 6. A first connection device 240 of the connection pin 24 is connected in an electrically conductive fashion there to the second connection device 460 of the shaped body 46. For this purpose, the first connection device 240 extends with the first connection means 242, the thread, through a cut out in the shaped body 46, in the region of the second connection device 460. The frictional connection between the connection devices is produced by a screw nut 480, as a second connection means, on the thread 242.

In addition, a current sensor 26 according to the prior art is arranged around the connection pin 24 here, so as to enclose it.

The connection pin 24 can be embodied as an integral component of a vehicle according to the invention. It is advantageous if in this arrangement of the power semiconductor module 3 the connection pin 24 automatically extends through the cut out 64 in the cooling device 6 to the vehicle without further positioning effort. In other words, as a result of the mechanical mounting of the power semiconductor module 3 the electrical contact is simultaneously brought about insofar as that only the frictional connection has to be formed between the first and second connection devices 24, 460. The standing foot 466 of the internal load-connecting element 46 serves here to support and absorb the forces which arise during the connection of the two connection means, that is to say during the formation of the screw connection.

The refinement according to FIG. 6 of the power electronic arrangement has the same switching device as that according to FIG. 5. The internal load-connecting element 46 is also embodied in the same way, but does not have a standing foot. The external load-connecting element 2 is basically embodied in the same way as that according to FIG. 4, but does not have its own insulation in the region of the extruded part 22.

Instead, the cooling device 6 has a step-shaped cut out 64 in which an insulating material body 640 is arranged. In the broad part of the cut out 64, a current sensor 26 is also arranged in such a way that it encloses the external load-connecting element 2.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic arrangement, comprising:
a power semiconductor module, and having an external load-connecting element, wherein:
the external load-connecting element has a first connection device;
the power semiconductor module has a housing, a base plate and an internal load-connecting element with a second connection device;
wherein the base plate has a first cut out through which the first connection device extends into an interior of the power semiconductor module and is connected therein a frictionally locking and electrically conductive fashion to the second connection device of the internal load-connecting element.

2. The power electronic arrangement, according to claim 1, wherein:
the base plate is at least one of a metal body and a metal body in combination with a cooling device.

3. The power electronic arrangement, according to claim 1, wherein:
an insulating material body, which electrically insulates the base plate with respect to the first connection device, is arranged in the first cut out in the base plate.

4. The power electronic arrangement, according to claim 1, wherein:
the external load-connecting element is a connection cable with the first connection device which is arranged in a materially bonded, frictionally locking or positively locking fashion.

5. The power electronic arrangement, according to claim 4, wherein:
the first connection device is a metallic extruded part, and has a first connection means for connecting in a frictionally locking manner to a second connection means.

6. The power electronic arrangement, according to claim 4, wherein:
a first connection means and a second connection means together form a bayonet connection;
the first connection means is at least one of a thread and a blind hole with an internal thread; and
the second connection means is at least one of a screw nut and a screw arranged with its thread in the thread of the blind hole.

7. The power electronic arrangement, according to claim 1, wherein:
the external load-connecting element is a connection pin with a first connection means for a frictionally locking connection to a second connection means.

8. The power electronic arrangement, according to claim 1, wherein:
the housing has a second cut out bounding a feed-through of a tool, and provides a connection portal to connect the first connection device to the second connection device in an electrically conductive fashion by means of an assigned first and second connection means.

9. An electrically powered vehicle (9), in combination with a power electronic arrangement according to claim 1, further comprising:
an energy storage device; and
having an electric drive motor as a main drive or auxiliary drive.

10. The electrically powered vehicle, according to claim 9, wherein:
at least one of the external load-connecting element is a connection pin that is an integral component of a mounting device; and the external load-connecting element is electrically insulated from a mounting device (94).

11. The electrically powered vehicle, according to claim 10, wherein:
the mounting device is an axle drive device.

\* \* \* \* \*